United States Patent [19]
Barber

[11] Patent Number: 5,832,045
[45] Date of Patent: Nov. 3, 1998

[54] METHOD AND APPARATUS FOR RECOVERING BAUD TIMING FROM CORRELATION OF INTERSYMBOL INTERFERENCE

[75] Inventor: Andrew C. Barber, Venice, Calif.

[73] Assignee: Harris Corporation, Melbourne, Fla.

[21] Appl. No.: 673,421

[22] Filed: Jun. 28, 1996

[51] Int. Cl.⁶ .............................. H03D 1/06; H03D 1/00; H03D 3/00; H01P 3/08
[52] U.S. Cl. ..................... 375/348; 375/340; 375/316; 329/304; 333/127
[58] Field of Search .................................. 375/348, 229, 375/233, 235, 340, 232, 316, 358, 371, 376, 222; 333/127; 329/304, 307, 325, 360

[56] References Cited

U.S. PATENT DOCUMENTS

| | | | |
|---|---|---|---|
| 4,494,242 | 1/1985 | Ehrenbard et al. | 375/371 |
| 4,849,703 | 7/1989 | Easley et al. | 375/376 |
| 4,896,334 | 1/1990 | Sayar | 375/371 |
| 5,276,711 | 1/1994 | Rossi | 375/348 |
| 5,675,612 | 10/1997 | Solve et al. | 375/233 |

*Primary Examiner*—Chi H. Pham
*Assistant Examiner*—Khai Tran
*Attorney, Agent, or Firm*—Charles E. Wands

[57] ABSTRACT

A signal processing arrangement adjusts baud timing in a communication system receiver, wherein an information signal comprised of $(\sin(x))/x$ function contributions of successively adjacent bits is received via a memoryless channel. The information signal is sampled in accordance with a baud sampling clock signal, to derive successive samples of bits contained in the information signal. The sampling clock signal has a baud sampling clock frequency that is adjusted by a phase locked loop in accordance with a timing error signal. The signal processing arrangement comprises an intersymbol interference (ISI) correlation-driven baud timing recovery scheme which makes use of the fact that, for a given bit, at all instances in time other than where its peak occurs, the channel will contain energy from adjacent bits, so that there will be a substantial correlation of channel energy among successively adjacent bits of a transmitted sequence. On the other hand, for baud timing accurately at the peak of a given bit, none of the energy of any other bit will contribute to the energy at that baud time. The timing error signal is based upon ISI-correlation of adjacent bits.

16 Claims, 2 Drawing Sheets

METHOD AND APPARATUS FOR RECOVERING BAUD TIMING FROM CORRELATION OF INTERSYMBOL INTERFERENCE

FIELD OF THE INVENTION

The present invention relates in general to communication systems and is particularly directed to a technique for deriving baud timing for sampling a received signal, by correlating measured intersymbol interference (ISI) between adjacent bits of a received data stream to derive an error term, which drives a baud timing recovery loop that generates the sampling clock signal.

BACKGROUND OF THE INVENTION

Quadrature amplitude modulation (QAM) modems, such as those using a memoryless channel, require an accurate method for recovering baud (or symbol) timing for good performance. This accuracy of determining baud timing becomes particularly critical as the constellation density increases, since error becomes an increasingly larger percentage of the noise margin. In addition, the ratio of baud rate to channel bandwidth affects sensitivity to timing error, with higher ratios resulting in an increase in timing sensitivity.

Techniques currently employed for baud timing recovery include carrier envelope detection, bit energy correlation, some of which may require or use digital signal processing (DSP). In a carrier envelope detection scheme, the received signal is rectified and the phase of the rectified signal is compared to a baud sampling clock, whose frequency is adjusted in a servo loop to maintain a prescribed phase relationship. Shortcomings of carrier envelope detection include the fact that it provides noisy error signal, is data pattern sensitive, and does not find optimum timing in the presence of intersymbol interference (ISI)/multipath conditions.

In the bit energy correlation technique, timing is adjusted so that the signal is sampled at the peak of the bit. However, since such a scheme does not generate a bipolar error signal, it requires two detectors operating at different phase angles. Moreover, this technique does not minimize intersymbol interference.

In order to use DSP techniques it is first necessary to digitize the signal which is then processed through a prescribed algorithm resident in the DSP chip. While single DSP chip processing is suitable for relatively low data rate modems, for higher speed modems multiple DSP chips may be required, increasing hardware and software complexity and, hence, cost.

SUMMARY OF THE INVENTION

In accordance with the present invention, the above described problems of conventional baud timing recovery schemes are successfully addressed by an ISI measurement scheme which makes use of the fact that, for a given bit, at all instances in time other than where its peak occurs, the channel will contain energy from adjacent bits; namely, there will be a substantial correlation of channel energy among successively adjacent bits of a transmitted sequence. On the other hand at the time where the peak of a given bit occurs, none of the energy of any other bit will contribute to the energy at that baud time. By measuring ISI using an energy-correlation technique to be described, what is obtained is a correlation error value that can be used to adjust a baud timing recovery loop which produces sampling clock at the correct baud time for the received signal.

In accordance with a first embodiment of the correlation-based baud timing recovery loop of the invention, a sample and hold circuit, such as that at the front end of a conventional equalizer section of the modem and containing a plurality of delay stages, is coupled to receive a baseband signal that is comprised of (sin(x))/x function contributions of the successively adjacent bits of the signal. A baud sampling clock for the sample and hold circuit is derived from a voltage controlled oscillator of a baud sample timing phase locked loop. Each sampled bit is successively clocked through successive ones of a pair of sequentially coupled delay stages of the equalizer. The contents of a selected delay stage are further coupled to a data demodulator, such as a binary bit slicer stage, which generates either a +1 or a −1 output, in accordance with the polarity of the sampled bit.

The bit decision produced by the data demodulator stage and the contents of the delay stage of interest are coupled to a subtraction stage, which generates an error value representative of the difference between the sampled bit value in the delay stage and the bit polarity value (+1 or −1) output by the subtraction stage. If the baud timing is accurate, the sampled data values stored in each of the successive delay stages would be either exactly a +1 or a exactly a −1, and the error output of subtractor would be zero. In practice, however, since the baud symbol timing is not expected to be exactly coincident with the peak and zero-crossing times of the successive sync functions manifested by the respective bits in the memoryless channel, the contents of each delay stage is some value other than zero, so that the subtraction stage produces some finite error value, indicating that baud timing is skewed and requires adjustment.

In a first embodiment of the invention, the error output of the subtraction stage is correlated with the signal sample values of the adjacent leading and trailing bits to determine how much energy of these adjacent bits has 'leaked' into the bit of interest, and thus how close or how far away the assumed baud time is to the correct baud time. This bit energy correlation is accomplished by multiplying the error signal produced by the subtraction stage by the adjacent leading and trailing bit values. The products are then summed to obtain an average of the contribution of each adjacent bit.

Due to the shape of the (sin(x))/x function, which manifests most of its energy within a single baud time on either side of the bit of interest, correlating the bit its two adjacent bits efficiently utilizes the relatively high degree of correlation or ISI gain between the bit and the two adjacent bits. The average correlation value is then filtered in a loop filter over a sufficient period of time to effectively null out the instantaneously noise. This noise-filtered error voltage is then coupled to the VCO from which the baud timing clock is derived.

In an alternative embodiment, rather that correlate against both adjacent bits, it is also possible to correlate only the leading bit with the bit of interest, which eliminates the need for one of the multipliers as well as the summation stage, and has the effect of adjusting the timing such that the leading bit generates no interference. Correlating to the average of both the leading and trailing bits in the first foregoing embodiment gives a better average or RMS baud timing error, but not a baud timing error measurement that will exactly cancel out interference with either the leading bit of the trailing bit. Correlating to only the leading bit can achieve pre-echo equalization as provided by a leading tap in a conventional equalizer, and eliminates moderate amounts of leading symbol ISI due to channel and filter impairments. A conventional decision feedback (DFB) equalizer is used to reduce the trailing symbol ISI.

DETAILED DESCRIPTION

Figure 1:
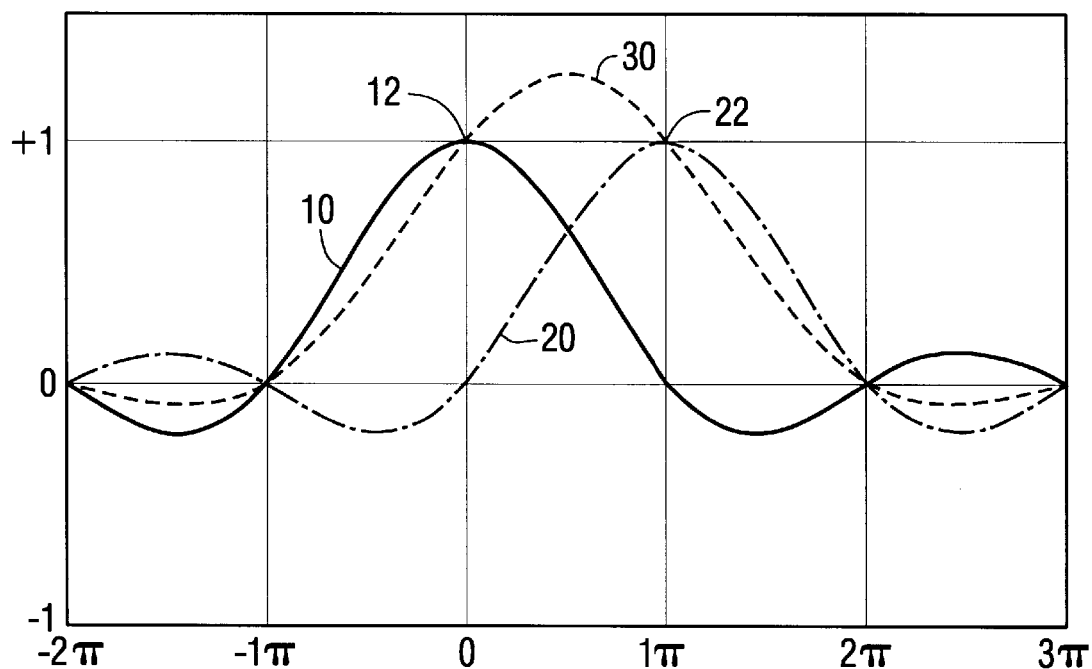
FIG. 1 shows the $(\sin(x))/x$ response of a memoryless channel for two positive pulses.

Before describing in detail the new and improved baud timing recovery scheme in accordance with the present invention, it should be observed that the invention resides primarily in what is effectively a prescribed arrangement of conventional communication circuits and components. Thus, the configuration of such circuits and components and the manner in which they are interfaced with other communication system equipment have, for the most part, been illustrated in the drawings in readily understandable block diagram format, so as to show only those specific details that are pertinent to the present invention, and not to obscure the disclosure with details which will be readily apparent to those skilled in the art having the benefit of the description herein. Thus, the block diagram illustration is primarily intended to show the major components of the system in a convenient functional grouping, whereby the present invention may be more readily understood.

In order to facilitate an appreciation of the ISI energy correlation-based baud timing recovery mechanism of the present invention, it is initially useful to observe the manner in which data bits are affected by the impulse response of a memoryless channel. More particularly, FIG. 1 shows the $(\sin(x))/x$ response 10 of a memoryless channel for a positive pulse or one bit, which contains a peak 12 at zero or ordinate intercept and nulls at integral (non-zero) multiples of $\pi$ along the abscissa, as the $(\sin(x))/x$ function symmetrically decreases on either side of zero. Also shown in FIG. 1 is another (adjacent) bit of the same polarity, namely another positive pulse, in what would be some sequence of bits transported over the channel, which bit has a $(\sin(x))/x$ function 20 with its peak 22 occurring at one baud time or $\pi$ later than the baud time at zero for the $(\sin(x))/x$ response 10 of the preceding positive bit. Because of the temporal proximity of bits 10 and 20, some of the energy in the bit 20 will overlap that of bit 10. For only the two illustrated bits what results is a composite waveform 30 having an amplitude that exactly matches that of each of the bits 10 and 20 at their peak times, is zero or null at all other baud times, and at some different value at all other times, giving rise to what is known as intersymbol interference (ISI).

Figure 2:
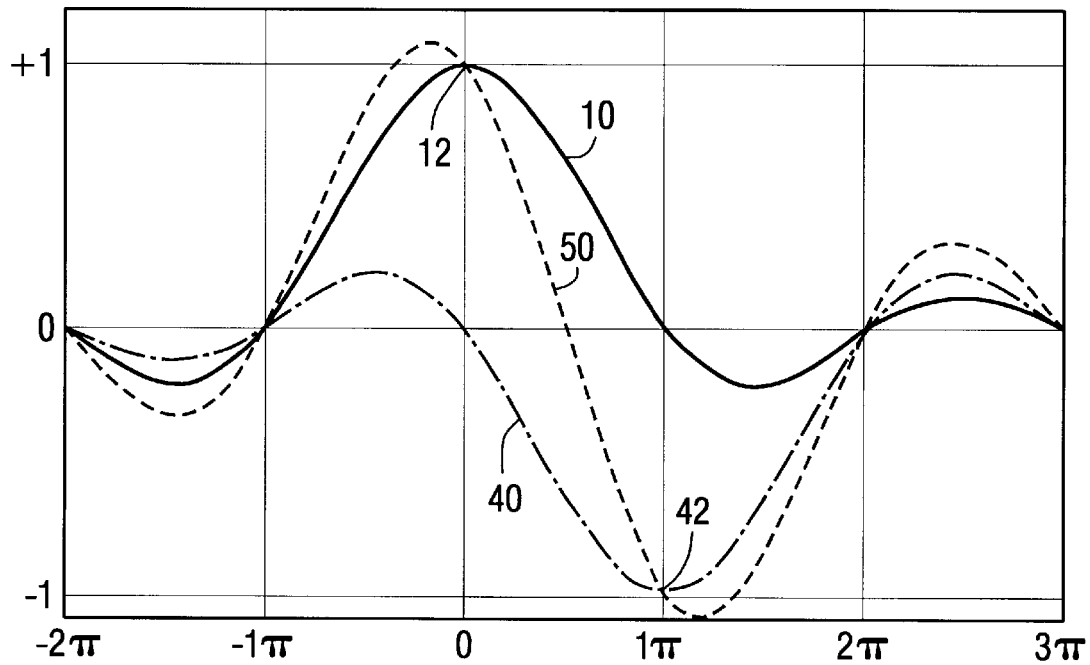
FIG. 2 shows the $(\sin(x))/x$ response of a memoryless channel for two opposite polarity pulses.

Similarly, FIG. 2 shows the $(\sin(x))/x$ response 10 of a memoryless channel for a positive pulse bit, plus another adjacent bit of opposite polarity, namely a negative pulse, which has a $(\sin(x))/x$ function 40 with its peak 42 displaced by one baud time or $\pi$ from the $(\sin(x))/x$ response 10 of the preceding first bit. Again, due to the temporal proximity of bits 10 and 40, some of the energy in the negative polarity bit 40 will overlap that of bit 10, producing the composite waveform 50. Again, for the two illustrated complementary polarity bits 10 and 40, their composite waveform 50 has an amplitude that exactly matches that of each of the bits 10 and 40 at their peak times, is zero or null at all other baud times, and at some different value at all other times.

If baud timing were always known a priori, a symbol detector could simply sample a received signal precisely at successive baud times which are known to coincide with successive peaks in the $(\sin(x))/x$ functions for respective bits, and which are also null times for the sync functions associated with all other bits and are therefore not influenced by other bits in the channel. However, since baud timing is not known, but is to be determined, the complexity of the received signal constitutes a substantial impediment to baud timing recovery, since whatever time is initially chosen as a starting point for baud timing can be expected to contain an energy contribution from the interfering sync functions of one or more bits. Indeed, from the impulse responses for the pairs of bits shown in FIGS. 1 and 2, it will be appreciated that additional bits of an arbitrary sequence of mixed like and opposite polarity bits will produce a composite ISI waveform that is very complex, as the energy of a greater number of successive symbols mutually overlap.

As described briefly above, this problem is solved in accordance with the present invention by an ISI measurement scheme which makes use of the fact that, for a given bit, at all instances in time other than where its peak occurs, the channel will contain energy from adjacent bits; namely, there will be a substantial correlation of channel energy among successively adjacent bits of a transmitted sequence. On the other hand at the time where the peak of a given bit occurs, such as baud time zero for the peak 12 of bit 10 in FIG. 1, as a non-limiting example, none of the energy of any other bit will contribute to the energy at that baud time. By actually measuring intersymbol interference (by means of an energy-correlation technique), rather than attempt to examine and/or adjust other signal characteristics to reduce ISI, what is obtained is a correlation value that can be used to adjust a baud timing recovery loop which produces sampling clock at the correct baud time for the received signal.

Figure 3:
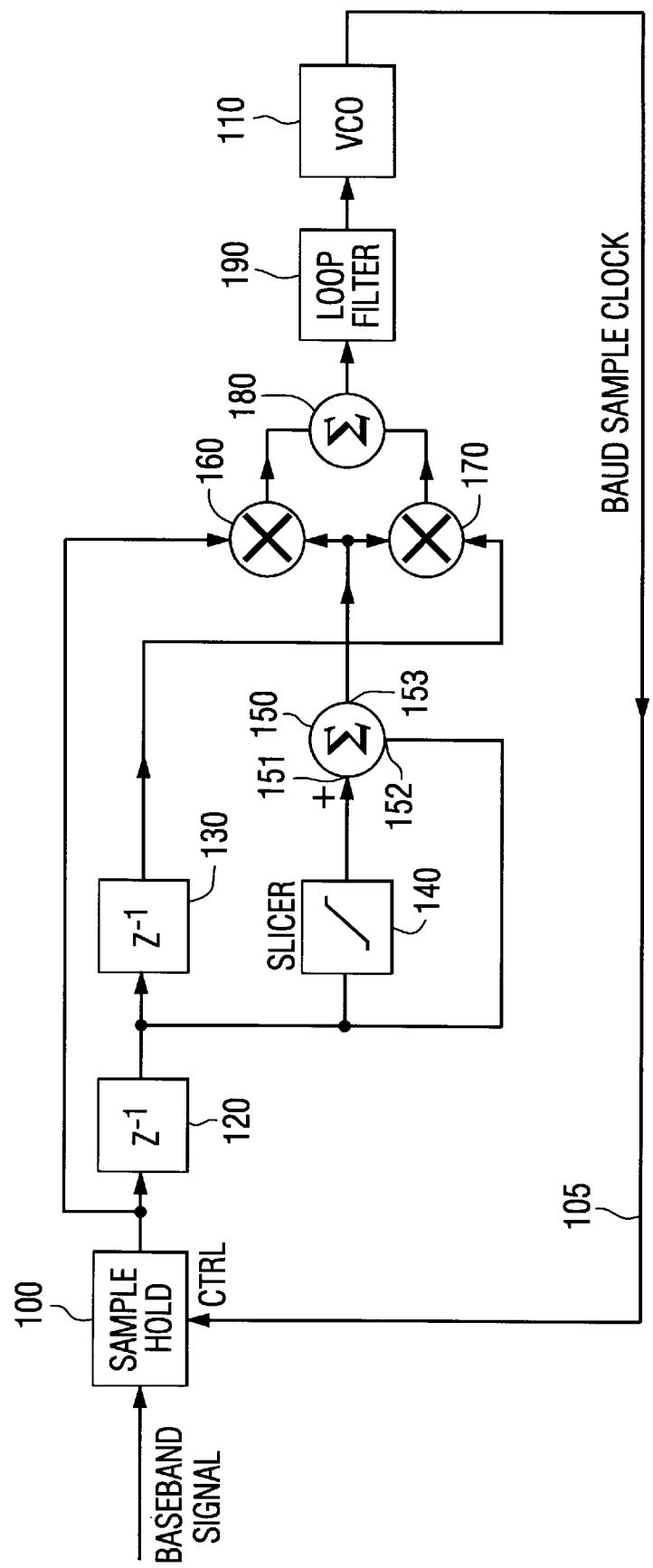
FIG. 3 diagrammatically illustrates an embodiment of a correlation-based baud timing recovery loop in accordance with the present invention.

FIG. 3 diagrammatically illustrates an embodiment of a correlation-based baud timing recovery loop in accordance with the present invention, as comprising a sample and hold circuit 100, which may be part of the front end of a conventional equalizer section containing a plurality of delay ($z^{-1}$) stages, and is coupled to receive a complex input (baseband) signal containing $(\sin(x))/x$ function contributions of successive bits, and thus have an ISI type waveform of the type shown in FIGS. 1 and 2 described above.

The baud sampling clock for the sample and hold circuit 100 is derived over an output line 105 from a voltage controlled oscillator (VCO) 110 of a baud sample timing phase locked loop. Sample and hold circuit 100 is operative to sample the complex waveform at an edge of the baud sampling clock supplied on line 105 and to store that value for the period of one baud time. As each sample is derived it is successively clocked through successive ones of a pair of sequentially coupled delay ($z^{-1}$) stages 120 and 130. The contents of delay stage 120 are further coupled to a data demodulator implemented as a conventional binary bit slicer stage 140, the output of which is either a +1 or a −1, in accordance with the polarity of the sampled signal at the baud sampling time.

The output of bit slicing data demodulator stage 140 is coupled to a first (+) input 151 of subtraction stage 150, while the contents of delay stage 120 are coupled to a second (−) input 152 of subtraction stage 150. Subtraction stage is operative to generate an error value at its output 153 representative of the difference between the contents of delay stage 120 and the bit polarity value (+1 or −1). If the baud timing is accurate, namely coincident with the peaks of the respective sync functions of the successive received bits, the sampled data values stored in each of the sample and hold circuit 100 and successive bit stage 120 and 130 would be either exactly a +1 (for a positive bit having sync function 10, for example, in FIG. 1), or a exactly a −1 (for a negative bit having sync function 40, for example, in FIG. 2). In this case, the (error) output of subtractor would be zero. In practice, however, since the baud symbol timing is not expected to be exactly coincident with the peak and zero-crossing times $(0, 1, 2, 3, \ldots, n\pi)$ shown in FIGS. 1 and 2, the contents of each stage of the sample storage stage chain (100-120-130) is some value other than zero, so that subtraction stage 150 produces some finite (not-zero) error value, indicating that baud timing is skewed and requires adjustment.

For this purpose, the error value at the output 153 of subtraction stage 150 is correlated with the signal sample values of the adjacent leading bit (the sampled bit value contents of delay stage 130) and the adjacent trailing bit (the sampled bit value contents of sample and hold circuit 100) to determine how much energy of these adjacent bits is leaking into the middle bit (corresponding to the bit associated with $z^{-1}$ stage 120) and thereby how close or how far away the assumed baud time is to the correct baud time. This bit energy correlation operation is accomplished by multiplying the error signal produced at the output 153 of subtraction stage 150 by the adjacent bit values stored in stages 100 and 140 and summing the products.

The error output 153 of the subtraction stage 150 is coupled to a first input of each of multipliers 160 and 170. A second input of multiplier 160 is coupled to receive the leading bit's sampled value stored in sample and hold circuit 100, while a second input of multiplier 170 is coupled to receive the trailing bit's sampled signal value stored in delay stage 130. The outputs of multipliers 160 and 170 are summed in summation stage 180 to produce a composite correlation energy value corresponding to the average of the correlations between the bit of interest (whose sampled value is stored in $z^{-1}$ stage 120) and its two immediately adjacent bits (the most recent or leading bit stored in sample and hold circuit 100, and the previous or trailing bit stored in $z^{-1}$ stage 130).

As can be seen from FIGS. 1 and 2, the $(\sin(x))/x$ function is a bipolar function passing through zero, and manifests most of its energy within a single baud time on either side of the bit. As a consequence, correlating the bit of interest with its two adjacent (immediately leading and trailing bits), produces a bipolar signal, which serves to efficiently utilize the relatively high degree of correlation or ISI gain between a respective bit and its two adjacent bits. The average correlation value produced by summation stage 180 is then coupled through a loop filter 190, which filters the summed error term over a sufficient period of time to effectively null out the instantaneously noise. This noise-filtered error voltage is then coupled to VCO 110 from which the baud timing clock is derived, as described above.

Where the summed correlation error term produced by summation stage 180 is relatively large, indicating that there is a substantial amount of inaccuracy in the baud sampling time, the resulting voltage will cause VCO 110 to produce a larger shift in output frequency than would be the case where the summed correlation error term produced by summation stage 180 is relatively small, indicating that the baud sampling time is relatively close to its correct timing, so that the smaller voltage will produce a considerably smaller adjustment of the output frequency generated by VCO 110 to bring the sampling edge of the baud timing sampling clock to a mid bit sampling location, so that there will be no effective correlation with adjacent bits.

In the foregoing embodiment, the correlation error used to drive the baud sampling clock is an average between leading and trailing bits and the bit of interest. However, rather that correlate against both adjacent bits, only the leading bit (stored in sample and hold register 100) is correlated with the contents of the first $z^{-1}$ delay stage 120. Correlating with only the leading bit eliminates the need for multiplier 170 and summation stage 180, and has the effect of adjusting the timing such that the leading bit generates no intersymbol interference. While correlating to the average of both the leading and trailing bits, as in the foregoing embodiment gives a better average or RMS baud timing error, it does not provide a baud timing error measurement that will exactly cancel out intersymbol interference with either the leading bit of the trailing bit. In an alternative embodiment of the invention of correlating to only the leading bit can achieve pre-echo equalization as provided by a leading tap in a conventional equalizer, and eliminates moderate amounts of leading symbol ISI due to channel and filter impairments. A conventional decision feedback (DFB) equalizer is used to reduce the trailing symbol ISI.

As will be appreciated from the foregoing description, the problems of conventional baud timing recovery schemes described above are successfully remedied by the ISI correlation-driven baud timing recovery scheme of the present invention, which makes use of the fact that, for a given bit, at all instances in time other than where its peak occurs, the channel will contain energy from adjacent bits, so that there will be a substantial correlation of channel energy among successively adjacent bits of a transmitted sequence. On the other hand, for baud timing accurately at the peak of a given bit, none of the energy of any other bit will contribute to the energy at that baud time. Measuring ISI using the energy-correlation technique described above provides a correlation error value for adjusting a baud timing recovery loop, which generates a sampling clock signal at the correct baud time for the received signal.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein, but intend to cover all such changes and modifications as are obvious to one of ordinary skill in the art.

What is claimed:

1. For use with a communication system receiver wherein an information signal received via a memoryless channel is sampled in accordance with a sampling clock signal, to derive successive samples of symbols contained in said information signal, said sampling clock signal having a sampling clock frequency that is adjusted by a phase locked loop in accordance with a timing error signal, so that sampling times of said information signal track variations in baud timing of said symbols contained in said information signal, a method of deriving said timing error signal comprising the steps of:

(a) storing successive samples of said information signal;

(b) demodulating the contents of a selected one of said successive samples stored in step (a) into a demodulated symbol value;

(c) correlating said demodulated symbol value with contents of at least one adjacent sample stored in step (a), so as to derive an error signal representative of an extent to which energy in said demodulated symbol value in said information signal correlates with energy in at least one symbol respectively associated with the contents of said at least one adjacent sample stored in step (a); and (d) generating said timing error signal in accordance with said error signal.

2. A method according to claim 1, wherein step (c) comprises correlating said demodulated symbol value with contents of a single adjacent sample stored in step (a), so as to derive said error signal representative of the extent to which energy in said demodulated symbol in said information signal correlates with energy in a symbol associated with the contents of said single adjacent sample stored in step (a).

3. A method according to claim 1, wherein step (c) comprises correlating said demodulated symbol value with contents of a leading adjacent sample stored in step (a), so as to derive said error signal representative of the extent to which energy in said demodulated symbol in said information signal correlates with energy in a symbol associated with the contents of said leading adjacent sample stored in step (a).

4. A method according to claim 1, wherein step (c) comprises correlating said demodulated symbol value with contents of leading and trailing adjacent samples stored in step (a), and deriving therefrom said error signal representative of the extent to which energy in said demodulated symbol in said information signal correlates with energy in symbols associated with the contents of said leading and trailing adjacent samples stored in step (a).

5. A method according to claim 1, wherein step (c) further comprises correlating said demodulated symbol value with contents of leading and trailing adjacent samples stored in step (a), so as to derive correlations therewith and summing said correlations into said error signal representative of the average extent to which energy in said demodulated symbol in said information signal correlates with energy in symbols associated with the contents of said leading and trailing adjacent samples stored in step (a).

6. A signal processing arrangement for adjusting baud timing in a communication system receiver, wherein an information signal received via a memoryless channel is sampled in accordance with a baud sampling clock signal, to derive successive samples of symbols contained in said information signal, said baud sampling clock signal having a baud sampling clock frequency that is adjusted by a phase locked loop in accordance with a timing error signal supplied thereto, so that sampling times of said information signal track variations in baud timing of said symbols contained in said information signal, said signal processing arrangement comprising:

a multistage delay line having a plurality of successive stages which store successive samples of said information signal;

a demodulator which is operative to demodulate the contents of a selected one of said successive samples stored in said successive stages of said multistage delay line into a demodulated symbol value; and a correlation stage which is operative to correlate said demodulated symbol value with contents of at least one of adjacent samples stored in said multistage delay line, so as to derive said timing error signal in dependence upon the extent to which energy in said demodulated symbol value in said information signal correlates with energy in at least one symbol respectively associated with the contents of said at least one adjacent sample, said timing error signal being coupled to said phase locked loop for adjusting said baud sampling clock frequency.

7. A signal processing arrangement according to claim 6, wherein said correlation stage is operative to correlate said demodulated symbol value with contents of a single adjacent sample stored in said multistage delay line, so as to derive said timing error signal representative of the extent to which energy in said demodulated symbol in said information signal correlates with energy in a symbol associated with the contents of said single adjacent sample.

8. A signal processing arrangement according to claim 6, wherein said correlation stage is operative to correlate said demodulated symbol value with contents of a leading adjacent sample stored in said multistage delay line, so as to derive said timing error signal representative of the extent to which energy in said demodulated symbol in said information signal correlates with energy in a symbol associated with the contents of said leading adjacent sample.

9. A signal processing arrangement according to claim 6, wherein said correlation stage is operative to correlate said demodulated symbol value with contents of leading and trailing adjacent samples stored in said multistage delay line, and deriving therefrom said timing error signal representative of the extent to which energy in said demodulated symbol in said information signal correlates with energy in symbols associated with the contents of said leading and trailing adjacent samples.

10. A signal processing arrangement according to claim 6, wherein said correlation stage is operative to correlate said demodulated symbol value with contents of leading and trailing adjacent samples stored in said multistage delay line, so as to derive correlations therewith and summing said correlations into an error signal representative of the average extent to which energy in said demodulated symbol in said information signal correlates with energy in symbols associated with the contents of said leading and trailing adjacent samples.

11. A signal processing arrangement for adjusting baud timing in a communication system receiver, wherein an information signal comprised of $(\sin(x))/x$ function contributions of successively adjacent bits is received via a memoryless channel and sampled in accordance with a baud sampling clock signal, to derive successive samples of bits contained in said information signal, said baud sampling clock signal having a baud sampling clock frequency that is adjusted by a phase locked loop in accordance with a timing error signal supplied thereto, so that sampling times of said information signal track variations in baud timing of said bits contained in said information signal, said signal processing arrangement comprising:

a plurality of successively coupled delay stages through which said successive samples of said information signal are sequentially clocked;

a demodulator which is operative to demodulate the contents of a selected one of said successive samples stored in said successive delay stages into a demodulated bit value; and a correlation stage which is operative to correlate said demodulated bit value with contents of at least one of adjacent samples clocked through said successive delay stages, so as to derive said timing error signal in dependence upon the extent to which energy in said demodulated bit correlates with energy in at least one bit respectively associated with the contents of said at least one adjacent sample, said timing error signal being coupled to said phase locked loop for adjusting said baud sampling clock frequency.

12. A signal processing arrangement according to claim 11, wherein said information signal is comprised of (sin(x))/x function contributions of successively transmitted bipolar signals, and wherein said demodulator is operative to demodulate the contents of a selected one of said successive samples stored in said successive delay stages into either a positive or negative binary bit value.

13. A signal processing arrangement according to claim 12, wherein said correlation stage is operative to correlate said demodulated bit value with contents of a single adjacent sample stored in one of said plurality of successively coupled delay stages, so as to derive said error signal representative of the extent to which energy in said demodulated bit in said information signal correlates with energy in a bit associated with the contents of said single adjacent bit sample.

14. A signal processing arrangement according to claim 12, wherein said correlation stage is operative to correlate said demodulated bit value with contents of a leading adjacent sample stored in one of said plurality of successively coupled delay stages, so as to derive said error signal representative of the extent to which energy in said demodulated bit in said information signal correlates with energy in a bit associated with the contents of said leading adjacent sample.

15. A signal processing arrangement according to claim 12, wherein said correlation stage is operative to correlate said demodulated bit value with contents of leading and trailing adjacent samples stored in one of said plurality of successively coupled delay stages, and deriving therefrom said error signal representative of the extent to which energy in said demodulated bit in said information signal correlates with energy in bits associated with the contents of said leading and trailing adjacent samples.

16. A signal processing arrangement according to claim 12, wherein said correlation stage is operative to correlate said demodulated bit value with contents of leading and trailing adjacent bit samples stored in one of said plurality of successively coupled delay stages, so as to derive correlations therewith and summing said correlations into an error signal representative of the average extent to which energy in said demodulated bit in said information signal correlates with energy in bits associated with the contents of said leading and trailing adjacent samples.

* * * * *